US007746119B2

(12) United States Patent
Wang

(10) Patent No.: US 7,746,119 B2
(45) Date of Patent: Jun. 29, 2010

(54) LEAKAGE COMPENSATION FOR SAMPLE AND HOLD DEVICES

(75) Inventor: Zhao-Jun Wang, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 12/233,463

(22) Filed: Sep. 18, 2008

(65) Prior Publication Data

US 2010/0066414 A1   Mar. 18, 2010

(51) Int. Cl.
*G11C 27/02* (2006.01)
(52) U.S. Cl. .......................................... 327/94; 327/93
(58) Field of Classification Search ............. 327/91–97; 344/122–125
See application file for complete search history.

(56) References Cited

U.S. PATENT DOCUMENTS

| 4,380,005 A | * | 4/1983 | Debord et al. ............. 341/118 |
| 5,691,657 A | | 11/1997 | Hirano et al. |
| 5,909,131 A | * | 6/1999 | Singer et al. ................ 327/91 |
| 6,175,254 B1 | * | 1/2001 | Corio .......................... 327/94 |
| 6,281,717 B1 | | 8/2001 | Thomas et al. |
| 6,753,912 B1 | * | 6/2004 | Wayne ........................ 348/241 |
| 6,937,174 B2 | * | 8/2005 | Higashi et al. .............. 341/122 |

OTHER PUBLICATIONS

European Search Report, Application No. 09 17 0332, mailed Oct. 22, 2009.

* cited by examiner

*Primary Examiner*—Hai L Nguyen
(74) *Attorney, Agent, or Firm*—Blakely Sokoloff Taylor & Zafman, LLP

(57) ABSTRACT

A sample and hold circuit in one aspect includes first and second switches. The first switch can be coupled to receive an input signal and to sample the input signal using a first capacitor. A first leakage current flows between first and second conductive terminals of the first switch and accumulates as a first leakage charge in the first capacitor. A second leakage current flows between the first and second conductive terminals of the second switch and accumulates as a second leakage charge in the second capacitor. An offset circuit produces a compensated sampled value by subtracting a quantity from a signal developed in response to the held sampled signal and charge accumulated through the first switch, wherein the quantity is developed in response to the accumulated leakage charge in the second capacitor.

22 Claims, 3 Drawing Sheets

LEAKAGE COMPENSATION FOR SAMPLE AND HOLD DEVICES

BACKGROUND INFORMATION

1. Field of the Disclosure

The present invention relates generally to sampling of electronic values and, more particularly, the present invention relates to storage of sample values.

2. Background

Electronic sampling is used by many electronic systems. Well known applications include applications such as audio, data acquisition, control, and the like. In some applications, a sampled value may need to be held for a relatively long period of time. For example, during regulation of a power supply, an analog peak input voltage may need to be detected. The sampled value may need to be held for a relatively long period of time (e.g., 10 ms). A sample and hold circuit can operate by converting the signal value to a current, which is then used to charge a capacitor so the sample can be stored. A switch can be used to selectively control when the capacitor is used to sample. In particular, the switch may be closed to allow the capacitor to charge, and opened to allow the capacitor to retain the sampled charge. The switch may also be closed again to release the sampled charge from the capacitor.

However, when using this particular sample and hold technique on an integrated circuit, there is normally a leakage current flowing through the switch, such that the amount of charge stored in the capacitor changes. For example, leakage current can cause additional charge to flow into and to be stored by the storage capacitor even after the switch has been opened. As the length of time that the value has been stored increases, the stored value increases due to additional charge buildup. When the stored charge has been held for a substantial time, the stored value may no longer be an accurate representation of the initially sampled value because of the additional charge buildup resulting from the leakage current. In another example, leakage current may flow from the capacitor and charge may flow out of the capacitor as duration of time increases, thus making the stored value substantially less than the initially sampled value after a longer time duration.

The effect of leakage current on the stored charge can be reduced by increasing the capacitance of the storage capacity. However, the resulting increased size of the capacitor can result in correspondingly higher costs for integrated circuit that incorporates the increased size capacitors. The effect of leakage current on the storage charge can also be reduced by improving the design of the storage capacitor. However, the improved design typically results in higher design and processing costs for manufacturing the integrated circuit that incorporates the capacitors having an improved design. As can be seen, these approaches generally increase costs and/or size of the circuit design.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
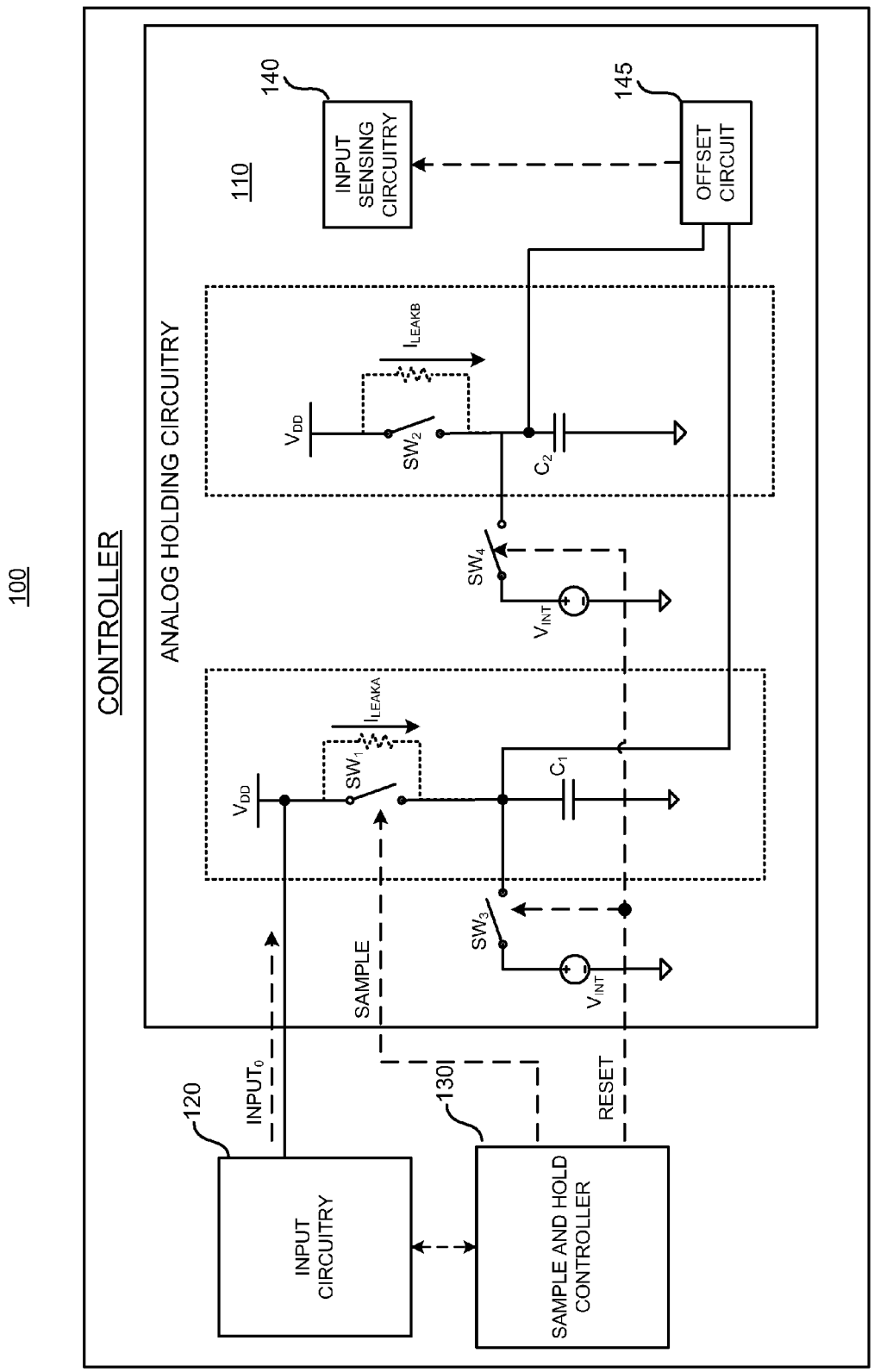
FIG. 1 is a schematic diagram that illustrates a sample and hold circuit in accordance with an embodiment of the present invention.

Methods and apparatuses for holding a sampled value for a long duration on a capacitor and substantially reducing the effects of switch leakage current on the stored value are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

An example technique for holding a sampled value for a long duration on a holding capacitor and substantially reducing the effects of switch leakage current on the stored value is now described. Examples of the present invention involve sampling and holding of a particular value by using a modeled leakage current to compensate for leakage current across the sample and hold switch. In another embodiment the switch may be coupled to enable a voltage representative of a certain value to be stored. More specifically the switch is "enabled" when the switch is conducting and the switch is "disabled" when the switch is substantially not conducting. The switch can be enabled (for example) by applying a high voltage (e.g., logic "1") to a control terminal of the switch. The switch can be disabled (for example) by applying a low voltage (e.g., logic "0") to a control terminal of the switch. The switch may then be disabled to hold the sampled value. Although limited embodiments are disclosed, the disclosure can also apply to other applications where maintaining a sampled analog value for a sustained period of time on an integrated circuit is desired.

A sample and hold circuit in one aspect includes first and second switches. The first switch can be coupled to receive an input signal and to sample the input signal using a first capacitor. A first leakage current flows between first and second conductive terminals of the first switch that accumulates as a first leakage charge in the first capacitor. A second leakage current flows between the first and second conductive terminals of the second switch that accumulates as a second leakage charge in the second capacitor. An offset circuit produces an offset sampled value by subtracting a quantity representing the charge accumulated on the second switch from a quantity representing the held sampled signal and charge accumulated through the first switch.

FIG. 1 shows one example of an integrated sample and hold circuit 100 in accordance with the teachings of the present invention. The sample and hold circuit 100 uses analog holding circuitry 110, in a configuration to sample an input signal $INPUT_0$ which is provided by input circuitry 120. In one example, input signal $INPUT_0$ may be, but is not limited to, representative of a peak of a rectified time varying input voltage. Input signal $INPUT_0$ is sampled utilizing switch $SW_1$ and the sampled value is stored utilizing capacitor $C_1$. However, switch $SW_1$ is typically not a perfect switch and allows current to leak between the conductive terminals, even when the switch is open. The leakage current can be modeled, for example, by a resistor coupled in parallel with the conductive terminals of the switch. As shown, a first conducting terminal of switch $SW_1$ is coupled to a voltage source $V_{DD}$.

Sample and hold controller 130 is configured to provide control signals for controlling analog holding circuitry 110. For example, sample and hold controller 130 provides a control signal SAMPLE that opens and closes switch $SW_1$ when a particular value represented by initially sampled input signal $INPUT_0$ is selected to be sampled by sample and hold controller 130. Sample and hold controller 130 also provides a RESET signal, which is used to open and close switches $SW_3$ and $SW_4$. In operation switch $SW_3$ is closed to set capacitor $C_1$ to an internal voltage $V_{INT}$. Similarly, switch $SW_4$ is closed to set capacitor $C_2$ to internal voltage $V_{INT}$. In one example, a single voltage source may be used to supply both capacitors $C_1$ and $C_2$ to internal voltage $V_{INT}$.

In one example, switches $SW_3$ and $SW_4$ are enabled at the same time to allow capacitors $C_1$ and $C_2$ to be set to the same voltage ($V_{INT}$). Once capacitors $C_1$ and $C_2$ have been set to the same voltage, internal voltage $V_{INT}$, switches $SW_3$ and $SW_4$ are disabled. In operation, switch $SW_1$ may now be selectively enabled by SAMPLE signal for a certain duration of time to allow the particular value represented by initially sampled value signal $INPUT_0$ to be stored on capacitor $C_1$. In one example, switches $SW_3$ and $SW_4$ are enabled and disabled to set capacitors $C_1$ and $C_2$ before a new value is to be stored on capacitor $C_1$.

As shown, analog holding circuitry 110 further comprises switch $SW_2$ that is configured to remain open to provide a leakage current that models the leakage current $I_{LEAKA}$ of switch $SW_1$. The leakage current of switch $SW_2$ is substantially equal to the leakage current of switch $SW_1$ because switch $SW_2$ is designed to have operating characteristics that are substantially similar to the operating characteristics of switch $SW_1$. In operation, during a time duration when capacitor $C_1$ is storing a voltage in response to initially sampled value $INPUT_0$, switch $SW_2$ is left open to collect leakage current $I_{LEAKB}$ on capacitor $C_2$. More specifically, switch $SW_2$ is configured to remain open to provide a leakage current $I_{LEAKB}$ that models the leakage current $I_{LEAKA}$ of switch $SW_1$ over a time duration. The leakage current $I_{LEAKB}$ of switch $SW_2$ is substantially equal to the leakage current $I_{LEAKA}$ of switch $SW_1$ because switch $SW_2$ is designed to have operating characteristics that are substantially similar to the operating characteristics of switch $SW_1$. In another example, leakage current $I_{LEAKA}$ and $I_{LEAKB}$ may be directly proportional to each other.

As shown, a first terminal of capacitor $C_1$ is coupled to an inverting terminal of OFFSET CIRCUIT 145. A first terminal of capacitor $C_2$ is coupled to a first input of OFFSET CIRCUIT 145. OFFSET CIRCUIT 145 is arranged to provide a stored input signal (INPUT) to SENSING CIRCUITRY 140. More specifically, OFFSET CIRCUIT 145 is configured to subtract the change of initially sample value $INPUT_0$ due to leakage current so that over a time duration stored input value are substantially equal to initially sampled value $INPUT_0$. In other words, stored input signal INPUT is offset by a certain value to represent the value of initially sampled input signal $INPUT_0$ after a time duration.

In operation, the voltage across capacitor $C_1$ is representative of initially sampled input signal $INPUT_0$ when initially stored. As time duration increases, leakage current $I_{LEAKA}$ from switch $SW_1$ increases the voltage across capacitor $C_1$ thus, distorting the original value stored on capacitor $C_1$. Since capacitor $C_2$ accumulates a charge form leakage current $I_{LEAKB}$ that is the substantially the same as a charge capacitor $C_1$ accumulates form leakage current $I_{LEAKA}$ over a certain time period, then offset circuit may subtract the voltage accumulated on capacitor $C_2$ from the voltage on capacitor $C_1$ such that the difference represented as the stored input signal INPUT is substantially the same value as the initially sampled value $INPUT_0$.

In one embodiment, stored input signal INPUT corresponds to the initially sampled input signal $INPUT_0$ by compensating for the leakage across the sampling switch $SW_1$. SENSING CIRCUITRY 140 is provided to interpret the stored input signal INPUT (which can represent, for example, a peak input voltage of a power converter during a cycle of the power converter).

In operation, sample and hold controller 130 asserts the RESET signal (e.g., by setting the RESET signal to a high voltage), which closes switch $SW_3$ and switch $SW_4$. Closing switches $SW_3$ and $SW_4$ sets the voltage and/or charge of capacitor $C_1$ and capacitor $C_2$ to a voltage $V_{int}$. As shown, $V_{int}$ can be two separate internal voltage sources with the same voltage value or, in another embodiment, a single voltage source that is coupled to the two holding capacitors, $C_1$ and $C_2$.

Switches $SW_3$ and $SW_4$ are included to reset capacitors $C_1$ and $C_2$ to the same voltage before a sample voltage (such as the initially sampled input signal $INPUT_0$) is received by capacitor $C_1$. Switches $SW_3$ and $SW_4$ are typically the same type of switch because both switches $SW_3$ and $SW_4$ may allow leakage current to flow into capacitors $C_1$ and $C_2$ or current to flow out of capacitors $C_1$ and $C_2$, thus changing the voltage across capacitor $C_1$ and $C_2$. In various embodiments, a scaled version of the switch to be modeled can be used (such as by using a current mirror that is scaled in accordance with the scale of the modeling switch).

Once capacitors $C_1$ and $C_2$ have been reset to a common voltage $V_{INT}$, sample and hold controller 130 disables signal RESET (opens $SW_3$ and $SW_4$) and selectively asserts the SAMPLE signal. Thus, sample and hold controller 130 controls the timing of the SAMPLE signal and thus the timing of when the analog holding circuitry 110 samples the initially sampled input signal $INPUT_0$. When the SAMPLE signal is enabled, an electrical quantity ($INPUT_0$) provided by input circuitry 120 is sampled. In one embodiment, the magnitude of the electrical quantity is typically determined by input circuitry 120 (although in various embodiments, input circuitry 120 can be combined with sample and hold controller 130 or other circuitry). Thus, sample and hold controller 130 controls the sampling time of capacitor $C_1$ by controlling the duration of the time that switch $SW_1$ is enabled (e.g., closed) to enable the charging of capacitor $C_1$.

The sampled electrical quantity can be a current and/or voltage and may be represented as a current and/or voltage. According to one embodiment, a peak voltage of a rectified AC line voltage is converted to a current and is input into analog holding circuitry 110, where it is typically held for around 10 ms.

In one embodiment the voltage across $SW_1$ when it is disabled can be identical to the voltage across $SW_2$ when it is disabled. In another embodiment, the voltage across $SW_2$ may be different and the value across capacitor $C_2$ can be scaled accordingly before it is subtracted from the value across $C_1$.

Analog holding circuitry 110 further comprises a second sample and hold circuit including switch $SW_2$, which is normally open, and a capacitor $C_2$. Switch $SW_2$ is typically the same design as switch $SW_1$ to allow for an accurate representation of the leakage current across switch $SW_1$. The second sample and hold circuit is utilized to determine the amount of leakage current being collected by capacitor $C_1$ during a time period in which the sample is held.

When the switches used by both sample and hold circuits are similar (e.g., when switch $SW_1$ and $SW_2$ have substantially similar designs), the amount of voltage change from the second sample and hold circuit can be subtracted from the voltage on the first sample and hold circuit to determine any change in voltage on the first capacitor $C_1$ due to leakage current. Thus, by subtracting the voltage across the second capacitor $C_2$ (capacitor $C_2$ holds the voltage from the switch leakage current) from the voltage across the first capacitor $C_1$ (capacitor $C_1$ is holding the stored value plus additional voltage due to switch leakage current), the stored value is derived by negating the effect of the leakage current.

Figure 2:
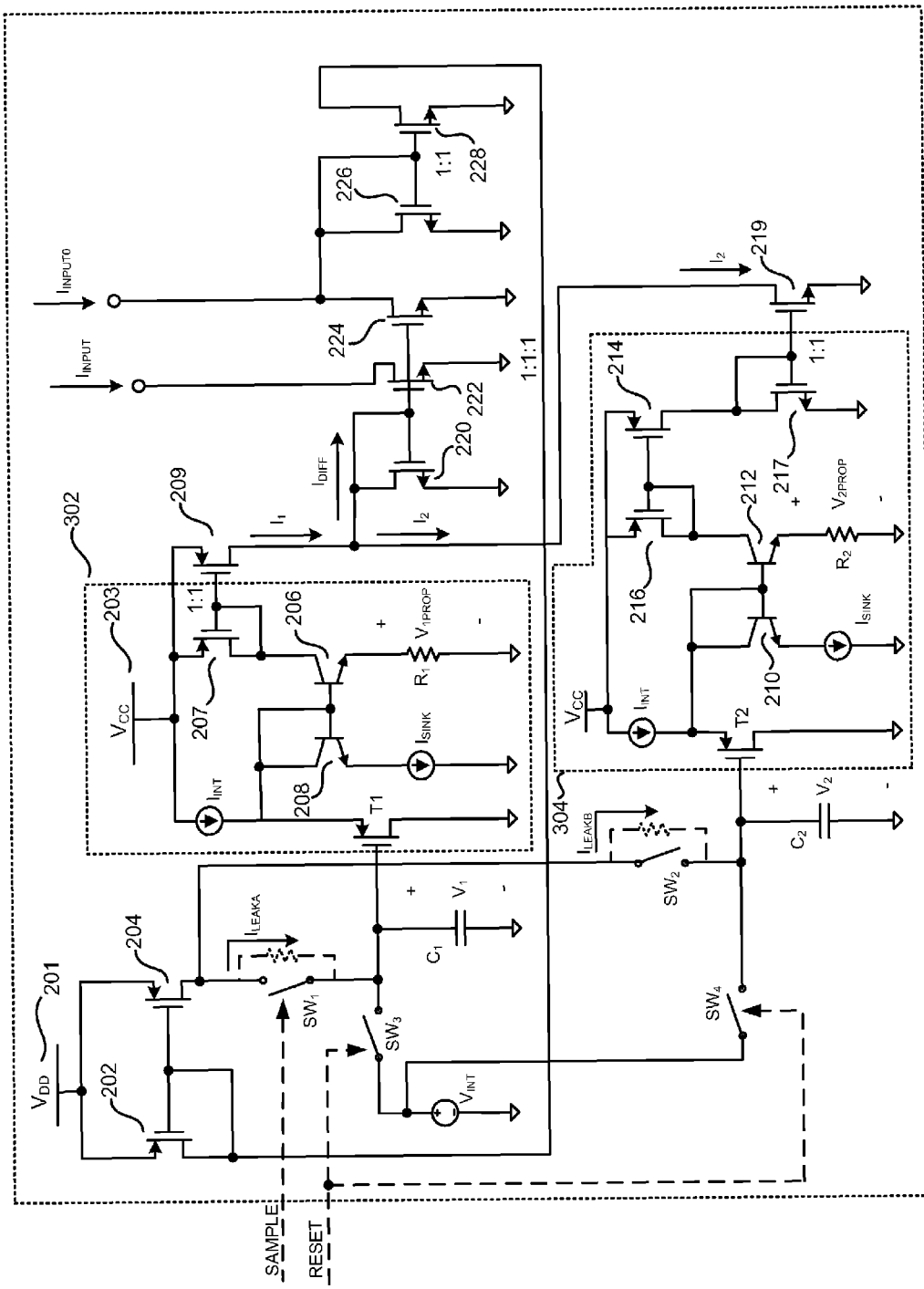
FIG. 2 is a schematic diagram of the sample and hold circuit of FIG. 1 which identifies particular currents and voltages to illustrate the operation in accordance with one embodiment of the present invention.

FIG. 2 is a schematic diagram of the sample and hold circuit of FIG. 1 which identifies particular currents and voltages to illustrate the operation in accordance in one embodiment of the present invention. As explained above with respect to FIG. 1, the RESET signal is a pulsed signal to enable and disable switch $SW_3$ and switch $SW_4$ to reset the values of capacitor $C_1$ and capacitor $C_2$. The SAMPLE signal is then applied to enable switch $SW_1$ such that capacitor $C_1$ is used to sample and store a voltage that is present at the drain of transistor 204. Transistor 204 is arranged in a current mirror arrangement (for buffering) under the control of transistor 202. A voltage from voltage supply $V_{DD}$ 201 is applied to transistors 202 and 204 of the current mirror. In various embodiments, voltage supply $V_{DD}$ 201 can be the same as or different from a voltage supply $V_{CC}$ 203, which is illustrated as supplying power to translator circuits 302 and 304. As discussed below, the current through the current mirror is controlled in response to current signal $I_{INPUT0}$. In particular, current $I_{INPUT0}$ is representative of initially sampled input signal $INPUT_0$.

The voltage produced at the drain of transistor 204 is applied to both an input terminal of switch $SW_1$ and an input terminal of switch $SW_2$. When switch $SW_1$ is closed in response to an assertion of the SAMPLE signal, capacitor $C_1$ samples the voltage that is produced in response to current $I_{INPUT0}$. When switch $SW_1$ is opened in response to a negation of the SAMPLE signal, capacitor $C_1$ holds the sampled voltage, which is subject to leakage of charge into capacitor $C_1$ across the opened switch $SW_1$.

The sampled voltage is applied to the gate of transistor T1 (transistor T1 has a high impedance input to prevent leakage of current from capacitor $C_1$) of translator circuit 302. Transistor T1 develops a voltage at the source of transistor T1 in response to the gate voltage and the current supplied by current source $I_{INT}$. The developed voltage is used to control the current mirror formed by bipolar transistors 206 and 208. The current flowing through the current mirror formed by transistors 206 and 208 is also controlled by the current source $I_{SINK}$ which is coupled to the emitter of transistor 208. The current mirror develops a voltage $V_{1PROP}$ across resistor $R_1$ in response to the current which is mirrored through transistor 206. Voltage $V_{1PROP}$ developed across resistor R1 is substantially proportional to voltage on capacitor $C_1$. A current mirror formed utilizing transistors 207 and 209 produces current I1, which represents the voltage across capacitor $C_1$. The current mirror formed using transistors 207 and 209 can be implemented using a current ratio of 1:1, although other ratios may be used.

As mentioned above, the voltage produced at the drain of transistor 204 is applied to an input terminal of switch $SW_2$. Leakage current across switch $SW_2$ (which is normally open) causes charge stored by capacitor $C_2$ to gradually rise. The voltage (V2) associated with the stored charge of capacitor $C_2$ is applied to the gate of transistor T2 (transistor T2 has a high impedance input to prevent leakage) of translator circuit 304. Transistor T2 develops a voltage at the source of transistor T2 in response to the gate voltage and the current supplied by current source $I_{INT}$. The developed voltage is used to control the current mirror formed by bipolar transistors 210 and 212. The current flowing through the current mirror formed by transistors 210 and 212 is also controlled by the current source $I_{SINK}$ that is coupled to the emitter of transistor 210. The current mirror develops a voltage across resistor R2 in response to the current that is mirrored through transistor 212. In particular, the voltage across resistor R2 is substantially proportional to the voltage across capacitor $C_2$. A current mirror that is formed using transistors 214 and 216 produces mirrored current that is used (in turn) to control the current flowing through another current mirror that is formed using transistors 217 and 219. The current mirror that is formed using transistors 217 and 219 produces the current I2, which represents the voltage across capacitor $C_2$. The current mirror that is formed using transistors 217 and 219 can be implemented using a current ratio of 1:1, although other ratios can be used.

When the ratios of the current mirror that is formed using transistors 207 and 209 and the current mirror that is formed using transistors 217 and 219 are equal (for example), current I2 can be subtracted from current I1 to produce a current ($I_{DIFF}$) that substantially represents the current $I_{INPUT0}$. When resistor R1 is equal to resistor R2 (R1=R2=R), $I_{DIFF}$ is equal to I1 minus I2, and thus is equal to (V1−V2)/R. Thus, $I_{DIFF}$ is representative of the difference between the voltages across V1 and V2, which is representative of the initially sampled input signal $INPUT_0$.

Current $I_{DIFF}$ is coupled to a current mirror formed by transistors 220, 222, and 224. The gate of transistor 220 is directly connected to the drain of transistor 220 such that transistor 220 functions as the controlling transistor of the current mirror. Thus transistors 222 and 224 are biased in response to the current $I_{DIFF}$. Because the leakage current across switches $SW_1$ and $SW_2$ is the same (or scaled appropriately), the change in voltage over time (such as within a 10 ms period) in both capacitors is the same. Because of initial setup conditions, current $I_{DIFF}$ represents an initial voltage sampled by capacitor $C_1$.

When initializing the circuit, current $I_{DIFF}$ is normally a null value as a result of switches $SW_3$ and $SW_4$ presetting capacitors $C_1$ and $C_2$ to the same voltage. Because capacitors $C_1$ and $C_2$ are equal, translators 302 and 304 produce currents I1 and I2 to be equal, resulting in no current difference. Therefore, final input current INPUT is representative of the initially sampled input signal $I_{INPUT0}$ at the time SAMPLE signal was asserted until capacitors $C_1$ and $C_2$ are reset by enabling and disabling switches $SW_3$ and $SW_4$ by asserting the RESET signal. The current mirror formed by transistors 226 and 228 buffers the $I_{INPUT0}$ signal and controls the current mirror formed by transistors 202 and 204. Thus current $I_{INPUT0}$ is mirrored such that the mirrored current in response to current $I_{INPUT0}$ can be sampled by pulsing switch $SW_1$. After $I_{INPUT0}$ is sampled, the voltage on capacitor $C_1$ is increased in response to the mirrored current. The increase on capacitor $C_1$ causes current I1 to increase, thus causing current $I_{DIFF}$ to increase proportionately to the increase on current I1. The voltages across capacitors $C_1$ and $C_2$ change at the same rate after initially sampled input $I_{INPUT0}$ has been sampled by capacitor $C_1$ such that the current $I_{DIFF}$ does not substantially change over a period of time.

Figure 3:
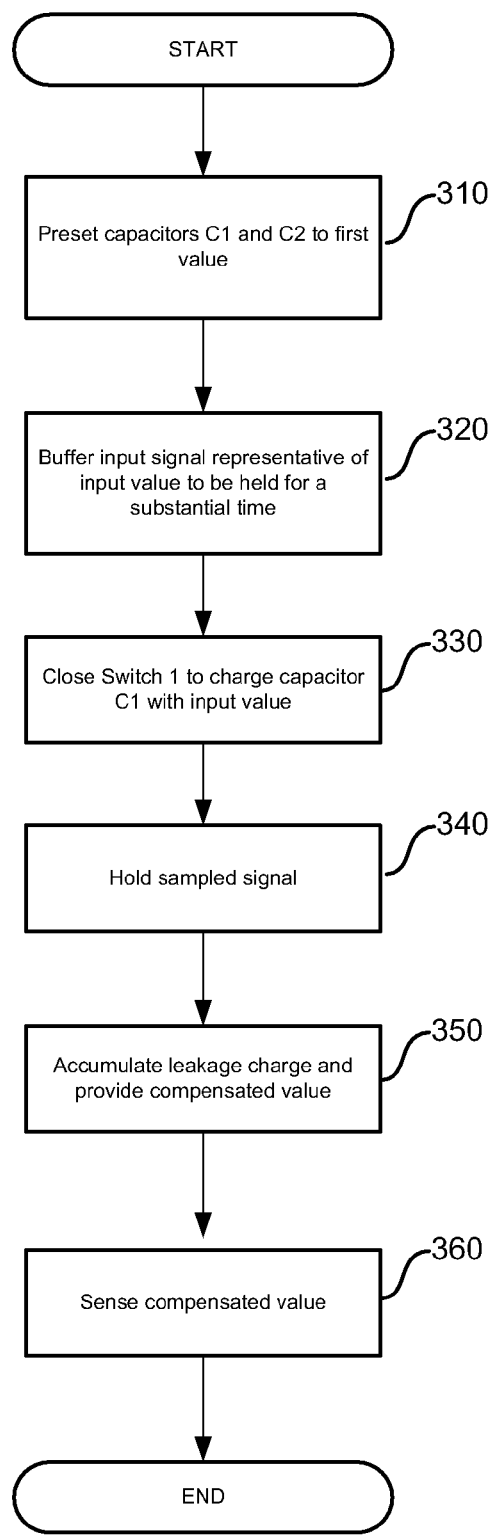
FIG. 3 is a flow diagram illustrating an example flow of the operation of the sample and hold circuit of FIG. 1 in accordance with one embodiment of the present invention.

FIG. 3 is a flow diagram illustrating an example flow of the operation of the sample and hold circuit of FIG. 1 in accordance with one embodiment of the present invention. In operation 310, first and second capacitors are preset to a first value. (The first value can be different from or the same as the value in the other capacitor.) In operation 320, a signal to be sampled is received and buffered. In operation 330, a first sample switch is closed and then opened to sample the buffered signal to be sampled. In operation 340, the sampled signal is held for a substantial time. A substantial time period can be a time period that is long enough for leakage across the sampling and preset switches to change the stored value. In operation 350, leakage across the sample switch is modeled using the second storage capacitor and subtracted from a value derived from the first storage capacitor to produce a compensated value. In operation 360, the compensated value is sensed by sensing circuitry.

The above description of illustrated examples of the present invention, including what is described in the Abstract, are not intended to be exhaustive or to be limiting as to the precise forms disclosed. While specific embodiments of, and examples for, the invention are described herein for illustrative purposes, various equivalent modifications are possible without departing from the broader spirit and scope of the present invention. Indeed, it is appreciated that the specific voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A sample and hold integrated circuit, comprising:
   a first switch having a first conductive terminal coupled to a buffer for receiving a buffered input signal and a second conductive terminal coupled to a first storage capacitor for sampling the buffered input signal, wherein the first switch is closed to produce a sampled input signal by sampling the buffered input signal and opened to decouple the first capacitor from the buffered input signal such that the sampled signal is held by the first capacitor, and wherein a first leakage current flows between the first and second conductive terminals of the first switch and to accumulate a first leakage charge in the first capacitor;
   a second switch having a first conductive terminal coupled to a voltage reference and a second conductive terminal coupled to a second storage capacitor for storing a second leakage current, wherein the second leakage current flows between the first and second conductive terminals of the second switch and to accumulate a second leakage charge in the second capacitor; and
   an offset circuit for producing a compensated sampled value by subtracting a quantity from a signal developed in response to the held sampled signal, wherein the quantity is developed in response to the accumulated leakage charge in the second capacitor.

2. The circuit of claim 1 further comprising a third switch that is coupled to preset the first capacitor to a first initial voltage.

3. The circuit of claim 2 further comprising a fourth switch that is coupled to preset the second capacitor to a second initial voltage.

4. The circuit of claim 3 wherein the third and forth switches preset the first and second capacitors to the first and second initial voltages every 10 ms (milliseconds).

5. The circuit of claim 1 wherein a first current is developed in response to a voltage across the first capacitor and a second current is developed in response to a voltage across the second capacitor.

6. The circuit of claim 5 wherein the compensated sampled value is produced by subtracting the first current developed in response to the voltage across the first capacitor from the second current developed in response to the voltage across the second capacitor.

7. The circuit of claim 5 wherein the first current developed in response to the voltage across the first capacitor is developed by coupling a high impedance input of a first transistor to the first terminal of the first capacitor.

8. The circuit of claim 7 wherein the first current developed in response to the voltage across the first capacitor is further developed by using a first bipolar current mirror to mirror a current produced by the first transistor.

9. The circuit of claim 1 wherein the second current developed in response to the voltage across the second capacitor is developed by coupling a high impedance input of a second transistor to the first terminal of the second capacitor and by using a second bipolar current mirror to mirror a current produced by the second transistor.

10. The circuit of claim 1 wherein the compensated sampled value is used to produce an output current representative of the compensated sampled value.

11. The circuit of claim 1, wherein the compensated sampled value is used to control a voltage coupled to the first terminal of the first switch.

12. The circuit of claim 1, wherein the first switch is opened and closed every cycle of a power converter.

13. A method for compensating for leakage in a sample and hold circuit, comprising:
   buffering a received input signal;
   closing a first switch to sample the buffered input signal to produce a sampled input signal, wherein the first switch is closed to produce the sampled input signal using a first capacitor such that the sampled input signal is held by the first capacitor;
   accumulating a first leakage charge in the first capacitor in response to a first leakage current that flows between first and second conductive terminals of the first switch;
   accumulating a second leakage charge in a second capacitor in response to a second leakage current that flows between first and second conductive terminals of the second switch; and
   producing a compensated sampled value by subtracting a quantity from a signal developed in response to the held sampled signal and the accumulated first leakage charge, wherein the quantity is developed in response to the accumulated leakage charge in the second capacitor.

14. The method of claim 13 further comprising presetting the first capacitor to a first initial voltage.

15. The method of claim 14 further comprising presetting the second capacitor to a second initial voltage.

16. The method of claim 13 further comprising developing a first current in response to a voltage across the first capacitor and developing a second current in response to a voltage across the second capacitor.

17. The method of claim 16 wherein the compensated sampled value is produced by subtracting the first current developed in response to the voltage across the first capacitor from the second current developed in response to the voltage across the second capacitor.

18. The method of claim 17 wherein the first current developed in response to the voltage across the first capacitor is further developed by using a first bipolar current mirror to mirror a current produced by the first transistor.

19. A sampling circuit for use in an integrated circuit, comprising:
a first switch coupled to receive an input signal and coupled to a first storage capacitor for sampling the input signal, wherein the first switch is closed to produce a charge in the first capacitor in response to the input signal such that sampled signal is held by the first capacitor, and wherein the first switch allows a first leakage current to flow between first and second conductive terminals of the first switch and to accumulate a first leakage charge in the first capacitor;
a second switch coupled to a second storage capacitor for storing a second leakage current, wherein the second switch allows the second leakage current to flow between the first and second conductive terminals of the second switch and to accumulate a second leakage charge in the second capacitor; and
an offset circuit for producing a compensated sampled value by subtracting a quantity from a signal developed in response to the held sampled signal and charge accumulated through the first switch, wherein the quantity is subtracted in response to the accumulated leakage charge in the second capacitor.

20. The switching circuit of claim 19 wherein third and forth switches preset the first and second capacitors, respectively, to first and second initial voltages every 10 ms (milliseconds).

21. The switching circuit of claim 20 wherein the offset sampled value is produced by subtracting a first current developed in response to the voltage across the first capacitor from a second current developed in response to the voltage across the second capacitor.

22. The switching circuit of claim 19 wherein the offset sampled value is used to produce an output current representative of the compensated sampled value.

* * * * *